United States Patent
Kawai

(10) Patent No.: US 11,870,432 B2
(45) Date of Patent: Jan. 9, 2024

(54) ELECTRONIC CIRCUITRY FOR DRIVING SEMICONDUCTOR DEVICE

(71) Applicant: KABUSHIKI KAISHA TOSHIBA, Tokyo (JP)

(72) Inventor: Shusuke Kawai, Fujisawa Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 209 days.

(21) Appl. No.: 17/249,356

(22) Filed: Feb. 26, 2021

(65) Prior Publication Data
US 2022/0077851 A1    Mar. 10, 2022

(30) Foreign Application Priority Data

Sep. 4, 2020    (JP) .................................. 2020-149313

(51) Int. Cl.
*H02M 1/08*    (2006.01)
*H03K 17/284*    (2006.01)
(Continued)

(52) U.S. Cl.
CPC ............ *H03K 17/284* (2013.01); *H02M 1/08* (2013.01); *H02M 7/53871* (2013.01);
(Continued)

(58) Field of Classification Search
CPC .. H02M 1/08; H02M 1/0012; H02M 7/53871; H02M 7/5387; H03K 17/284;
(Continued)

(56) References Cited

U.S. PATENT DOCUMENTS

| 8,836,311 B2 | 9/2014 | Tai et al. |
| 10,523,192 B2 | 12/2019 | Nomura |

(Continued)

FOREIGN PATENT DOCUMENTS

| JP | 2012-227877 A | 11/2012 |
| JP | 2014-75694 A * | 4/2014 |

(Continued)

OTHER PUBLICATIONS

Xin Cheng, et al., "A New FPGA-Based Segmented Delay-Line DPWM With Compensation for Critical Path Delays," IEEE Trans. on Power Elec., vol. 33, No. 12, pp. 10794-10802 (2018).

(Continued)

*Primary Examiner* — Kyle J Moody
*Assistant Examiner* — Jye-June Lee
(74) *Attorney, Agent, or Firm* — Finnegan, Henderson, Farabow, Garrett & Dunner, LLP

(57) ABSTRACT

Electronic circuitry includes a control circuit controlling a drive circuit for a semiconductor device; and a delay circuit receiving a first signal instructing the drive circuit to drive the semiconductor device with first driving force and output the first signal to the control circuit. The delay circuit receives a second signal at an interval of a first time or "n" times of the first time after the first signal is received, "n" being an integer greater than or equal to 2, and the second signal instructing the drive circuit to drive the semiconductor device with second driving force, delays outputting of the second signal for a delay time shorter than the first time, and outputs the second signal to the control circuit after the first signal is outputted and further after the first time or "n" times of the first time and the delay time elapses.

14 Claims, 11 Drawing Sheets

(51) Int. Cl.
*H02M 7/5387* (2007.01)
*H02P 27/08* (2006.01)
(52) U.S. Cl.
CPC ...... *H02P 27/08* (2013.01); *H03K 2217/0063* (2013.01); *H03K 2217/0072* (2013.01)
(58) Field of Classification Search
CPC .... H03K 2217/0063; H03K 2217/0072; H02P 27/08
See application file for complete search history.

(56) References Cited

U.S. PATENT DOCUMENTS

| | | |
|---|---|---|
| 10,530,349 B1 * | 1/2020 | Araragi ................. H03K 21/38 |
| 10,749,519 B2 | 8/2020 | Wada |
| 11,183,858 B2 | 11/2021 | Takeda |
| 2019/0334456 A1 | 10/2019 | Kashima |

FOREIGN PATENT DOCUMENTS

| | | |
|---|---|---|
| JP | 6497475 B1 | 4/2019 |
| WO | WO 2009/054143 A1 | 4/2009 |
| WO | WO 2018/042636 A1 | 3/2018 |
| WO | WO 2018/198426 A1 | 11/2018 |
| WO | WO 2018/225436 A1 | 12/2018 |

OTHER PUBLICATIONS

M. Blank, et al., "Digital Slew Rate and S-Shape Control for Smart Power Switches to Reduce EMI Generation," IEEE Trans. on Power Elec., vol. 30, No. 9, pp. 5170-5180 (2015).

* cited by examiner

US 11,870,432 B2

ELECTRONIC CIRCUITRY FOR DRIVING SEMICONDUCTOR DEVICE

CROSS REFERENCE TO RELATED APPLICATIONS

This application is based upon and claims the benefit of priority from the prior Japanese Patent Application No. 2020-149313, filed on Sep. 4, 2020, the entire contents of which are incorporated herein by reference.

FIELD

Embodiments described herein relate to electronic circuitry and a power converter.

BACKGROUND

Lowering the speed of a rise in drain voltage of a power semiconductor device while reducing a loss caused to the power semiconductor device necessitates inputting a complicated gate drive waveform to a gate terminal of the power semiconductor device. One method of generating the complicated waveform is a method using a digital-to-analog converter (DAC).

Unfortunately, generating a gate drive waveform for the power semiconductor device by this method requires a high-speed DAC and a large storage capacity (hereinafter referred to as a memory capacity) for storing digital signals.

DETAILED DESCRIPTION

Figure 1:
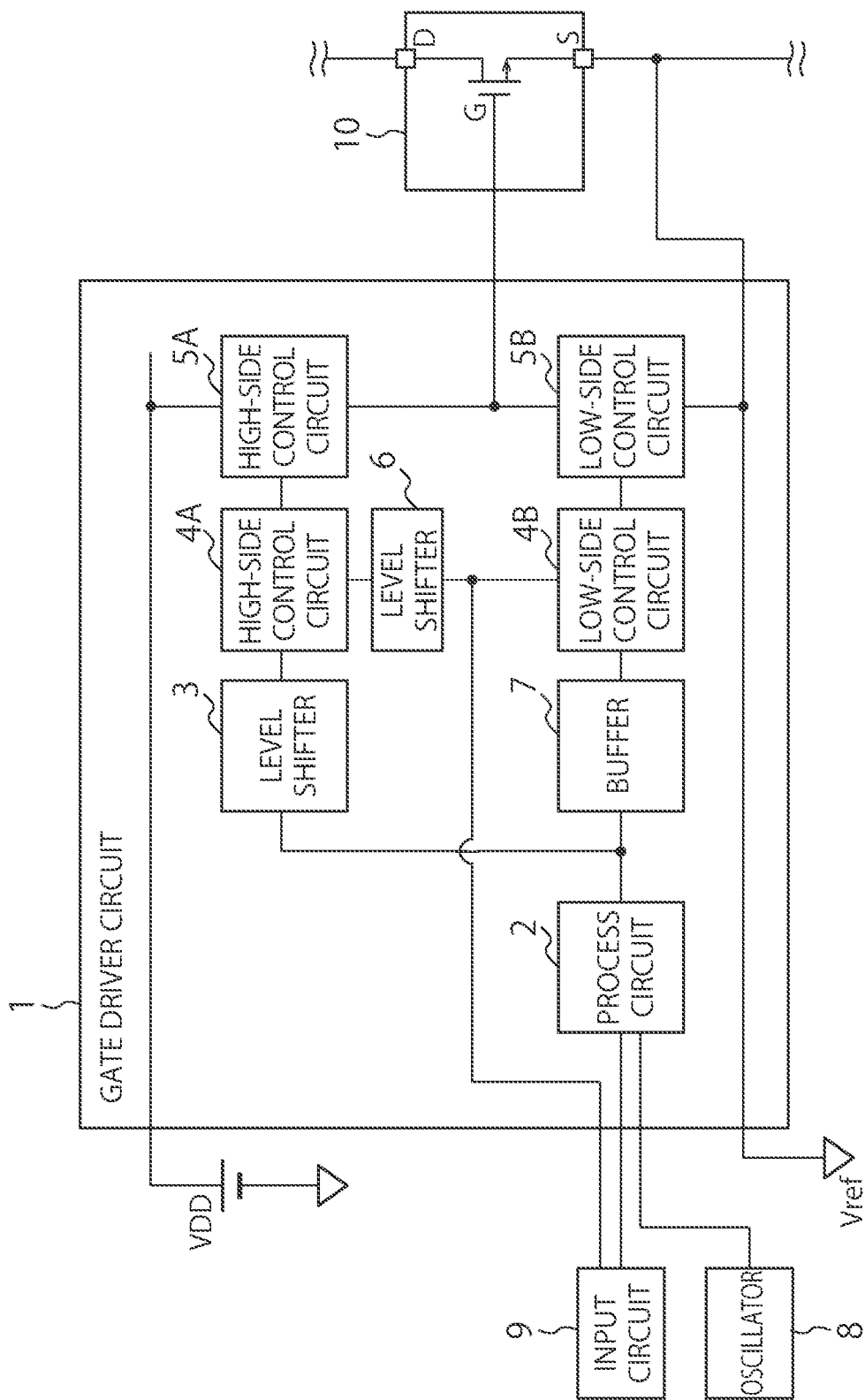
FIG. 1 is a block diagram of a circuit system according to a first embodiment of the present invention.

According to one embodiment, electronic circuitry includes: a control circuit configured to control a drive circuit for a semiconductor device; and a delay circuit configured to receive a first signal instructing the drive circuit to drive the semiconductor device with first driving force and output the first signal to the control circuit.

The delay circuit is configured to receive a second signal at an interval of a first time or "n" times of the first time after the first signal is received, "n" being an integer greater than or equal to 2, and the second signal instructing the drive circuit to drive the semiconductor device with second driving force.

The delay circuit is configured to delay outputting of the second signal for a delay time shorter than the first time.

The delay circuit is configured to output the second signal to the control circuit after the first signal is outputted and further the first time or "n" times of the first time and the delay time elapses.

Embodiments of the present invention will now be described with reference to the drawings. Main components of electronic circuitry and a power converter will be primarily described below. However, components and functions that are not shown in the drawing or are not described may exist in the electronic circuitry and the power converter. The following description should not be construed to exclude components and functions that are not shown in the drawing or not described.

First Embodiment

FIG. 1 is a block diagram of a circuit system according to an embodiment of the present invention. The circuit system of FIG. 1 includes a gate driver circuit 1 that is electronic circuitry according to the present embodiment, a power semiconductor device 10 that is a semiconductor device driven by the gate driver circuit 1, an input circuit 9, and an oscillator 8. In an example of FIG. 1, the oscillator 8 is disposed outside the gate driver circuit 1. The oscillator 8 may be disposed inside the gate driver circuit 1. The gate driver circuit 1 is connected between a source voltage VDD and a reference voltage Vref. The power semiconductor device 10 is an n-channel field-effect transistor (hereinafter referred to as an NMOS transistor). The power semiconductor device 10 may be a PMOS transistor, a bipolar transistor, a thyristor, an insulated-gate bipolar transistor (IGBT), or another power device. A drain terminal of the power semiconductor device 10 is connected to a predetermined node, and a source terminal of the power semiconductor device is connected to the reference voltage Vref. A reference voltage of the source terminal is not limited to Vref and may be a voltage other than Vref. The predetermined node is, for example, a terminal of a device such as a source voltage or another transistor. The gate driver circuit 1 receives signals of gate waveform generation data from the input circuit 9. The gate waveform generation data contains information needed to generate a desired waveform of a gate voltage applied to a gate terminal (a control terminal) of the power semiconductor device 10. The gate driver circuit 1 operates in accordance with information contained in the gate waveform generation data to generate a gate voltage (a control voltage) having a desired waveform and supply the generated gate voltage to the gate terminal of the power semiconductor device 10. The gate voltage is a voltage for driving the power semiconductor device 10.

Figure 2:
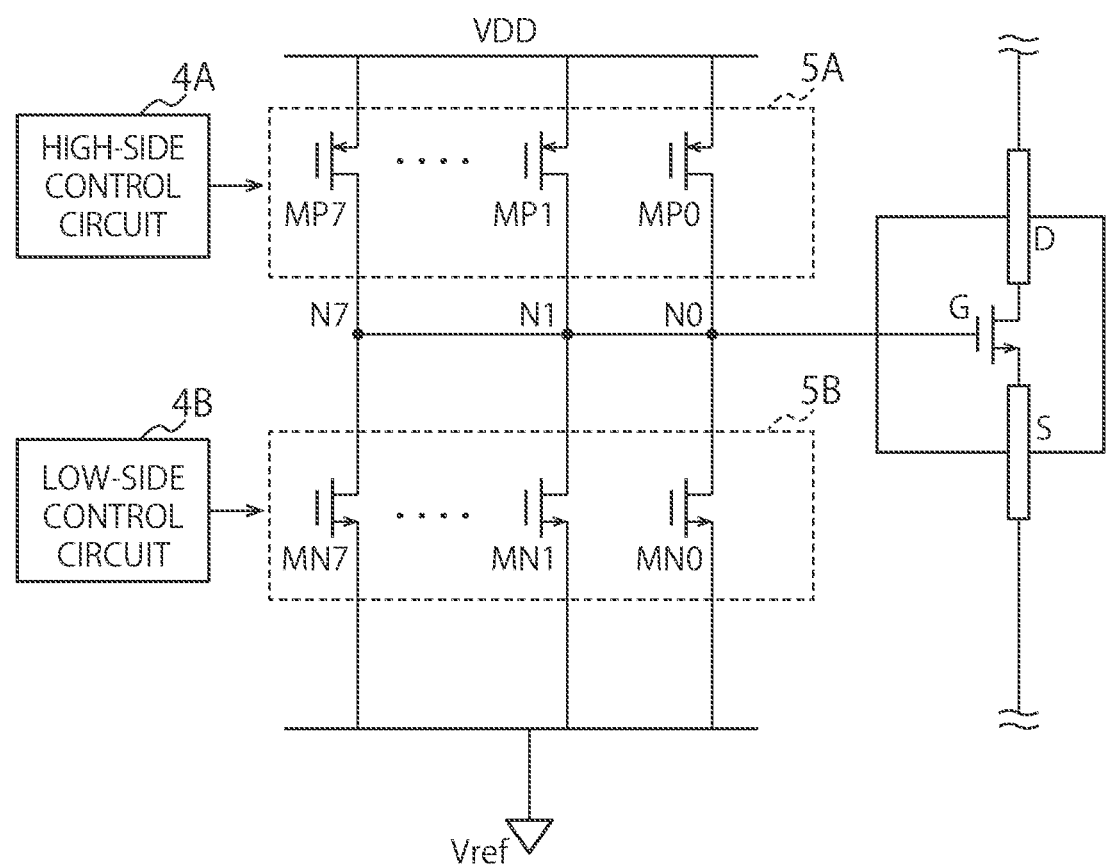
FIG. 2 is a schematic circuit diagram of a high-side drive circuit and a low-side drive circuit.

FIG. 2 is a schematic circuit diagram of a high-side drive circuit 5A and a low-side drive circuit 5B. The high-side drive circuit 5A includes a plurality of PMOS transistors MP0 to MP7 as a plurality of parallel-connected switching devices. The low-side drive circuit 5B includes a plurality of NMOS transistors MN0 to MN7 as a plurality of parallel-connected switching devices.

Source terminals of the PMOS transistors MP0 to MP7 are connected to the source voltage VDD, and drain terminals of the PMOS transistors are connected to drain terminals of the NMOS transistors MN0 to MN7. Source terminals of the NMOS transistors MN0 to MN7 are connected to the reference voltage Vref. Nodes N0 to N7 at which the PMOS transistors MP0 to MP7 and the NMOS transistors MN0 to MN7 are connected together are connected to the gate terminal of the power semiconductor device 10. In an example of FIG. 2, the number of the PMOS transistors and the number of the NMOS transistors are each eight. However, the number of the PMOS transistors and the number of the NMOS transistors are not limited to any specific value, as long as the numbers are each greater than or equal to two.

A high-side control circuit 4A controls gate voltages supplied to the PMOS transistors MP0 to MP7 to control switching between on and off states of the PMOS transistors MP0 to MP7. A low-side control circuit 4B controls gate voltages supplied to the NMOS transistors MN0 to MN7 to control switching between on and off states of the NMOS transistors MN0 to MN7.

To drive (turn on) the power semiconductor device 10, the high-side control circuit 4A turns on at least one of the PMOS transistors MP0 to MP7. All the NMOS transistors MN0 to MN7 are turned off. An increase in the number of the turned-on PMOS transistors increases an amount of current supplied to the gate terminal of the power semiconductor device 10. In other words, an increase in the amount of current supplied to the gate terminal speeds up a speed at which the gate voltage rises. The power semiconductor device 10 is turned on by the gate voltage greater than a threshold level, and the amount of current flowing in the power semiconductor device increases with a rise in gate voltage. In other words, with an increase in the number of the turned-on PMOS transistors, driving force with which the power semiconductor device 10 is driven increases. The number of the PMOS transistors that are turned on or off represents a degree of driving force of the power semiconductor device 10. The driving force generated when the number of the turned-on transistors is one differs from the driving force generated when the number of the turned-on transistors is two. To supply a gate voltage having a desired waveform to the gate terminal of the power semiconductor device 10, the number of the turned-on MOS transistors MP0 to MP7 and time for which the transistors are turned on can be controlled to generate the desired waveform of the gate voltage. For instance, a waveform of the gate voltage can be generated such that the drain voltage does not rapidly rise (a derivative value of the gate voltage is constant, for example).

To stop driving (turn off) the power semiconductor device 10, the low-side control circuit 4B turns on at least one of the NMOS transistors MN0 to MN7. All the PMOS transistors MP0 to MP7 are turned off. An increase in the number of the turned-on NMOS transistors can increase a rate at which the amount of current flowing in the power semiconductor device 10 decreases. To supply a gate voltage having a desired waveform to the gate terminal of the power semiconductor device 10, the number of the turned-on MOS transistors MN0 to MN7 and time for which the transistors are turned on can be controlled to generate the desired waveform of the gate voltage.

For a period (a control duration) from a time at which the power semiconductor device 10 is turned on to a time at which the power semiconductor device is turned off, a relationship established between the number of the turned-on transistors (a turned-on transistor count) and time to generate a desired gate voltage waveform is predetermined.

Figure 3:
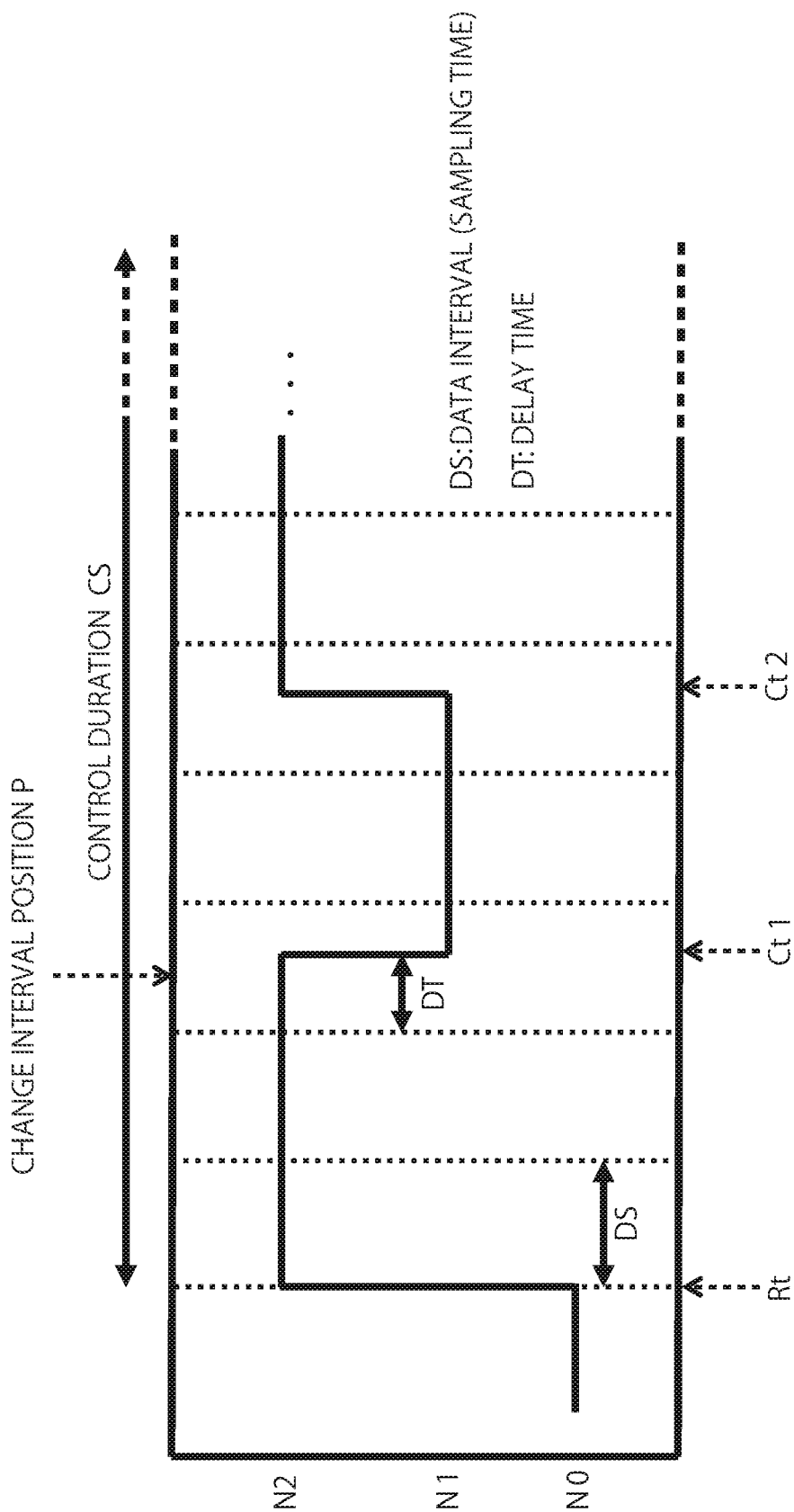
FIG. 3 shows a waveform to illustrate an example of a relationship between the number of turned-on transistors and time.

FIG. 3 shows a waveform to illustrate an example of a relationship established between the turned-on transistor count and time to generate a desired gate voltage waveform. The horizontal axis represents time, and the vertical axis represents turned-on transistor count. A time at which the power semiconductor device 10 is turned on, or a time at which the power semiconductor device 10 is instructed to be turned on, is a reference time Rt. Before the reference time Rt, the turned-on transistor count is "N0" ("N0" is, for example, 0).

At and after the reference time Rt, a period for which the gate voltage is controlled (a period for which the power semiconductor device 10 is turned on) corresponds to a control duration CS for the power semiconductor device 10. At and after the reference time Rt, the control duration CS is divided into data intervals DS of constant time widths. A time of the data interval DS corresponds to a sampling time or a first time.

At the reference time Rt, "N2" of the PMOS transistors are turned on. After the reference time Rt, the turned-on transistor count is "N2" for the first two data intervals DS. In the middle of the third data interval DS, the turned-on transistor count is changed to "N1". Specifically, at a time Ct1 after a lapse of a delay time DT since a starting time of the third data interval DS, the turned-on transistor count is changed to "N1." After the power semiconductor device 10 is turned on at the time Rt, a position of the data interval (in this example, the third data interval) in which the turned-on transistor count is changed for the first time is referred to as a change interval position. The change interval position and information identifying the change interval position will be described as a change interval position P and change interval position information P, respectively.

Afterward, at a time Ct2 after a lapse of a time of the two data intervals (a sum of two sampling times) since the time Ct1, the turned-on transistor count is changed to "N2".

Afterward, the turned-on transistor count remains constant at "N2" until an end of the control duration CS. However, the turned-on transistor count may be changed in a unit of the sampling time.

In the present embodiment, the gate driver circuit is configured to execute a process of generating a desired gate voltage waveform with a small memory capacity and a low digital output rate (a sampling rate) from memory by controlling the turned-on transistor count with time. A description will be given below based on the example of FIG. 3.

In FIG. 1, the input circuit 9 outputs signals carrying information (the change interval position information P, on/off instruction signals for the power semiconductor device 10) to a process circuit 2, which requires that information. The input circuit 9 also outputs signals carrying information on the delay time DT to the high-side control circuit 4A and the low-side control circuit 4B.

The oscillator 8 generates a clock and outputs the generated clock to the process circuit 2. The oscillator 8 may also output the clock to the high-side control circuit 4A or the low-side control circuit 4B.

Figure 4:
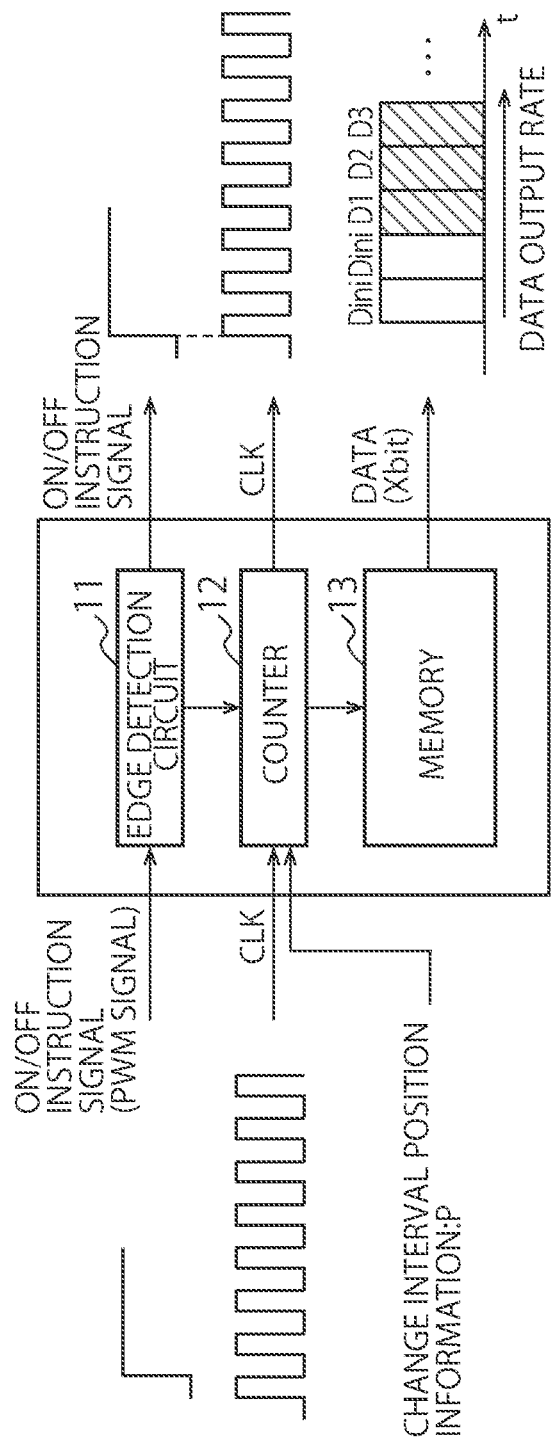
FIG. 4 is a schematic block diagram of a process circuit.

FIG. 4 is a schematic block diagram of the process circuit 2. The process circuit 2 includes an edge detection circuit 11 (a first detection circuit), a counter 12 (a second counter), and a memory 13 (a storage circuit). The components shown in FIG. 4 are provided for each of the high-side and low-side circuits. In FIG. 4, either the high-side or low-side circuit is shown. The process circuit 2 is connected to the oscillator 8 and the input circuit 9.

The counter 12, into which a clock is input, counts the number of pulses from the clock. The counter 12 outputs (sends) the input clock to a circuit downstream of the counter. The downstream circuit is either a level shifter 3 used for the counter 12 for the high side or a buffer 7 used for the counter 12 for the low side.

An on/off instruction signal (a third signal) is input to the edge detection circuit 11 to instruct the drive circuit to cause the power semiconductor device 10 to be turned on (in conduction) or be turned off (non-conduction). An on-signal is input to the edge detection circuit 11 for the high side, whereas an off-signal is input to the edge detection circuit 11 for the low side.

In one example, the on/off instruction signal is in the form of a pulse-width modulation (PWM) signal. The edge detection circuit 11 detects an edge of a PWM signal. The edge corresponds to a time to give an instruction to turn on the power semiconductor device 10 that is turned on (conduction) and turned off (non-conduction).

When detecting the edge, the edge detection circuit 11 outputs an edge detection signal to the counter 12. When the edge detection signal is input, the counter 12 starts counting the number of pulses from the clock. The edge detection circuit 11 synchronizes the on/off instruction signal with the clock output from the counter 12 and outputs (sends) the on/off instruction signal to a circuit downstream of the edge detection circuit. The downstream circuit is either the level shifter 3 used for the edge detection circuit 11 for the high side or the buffer 7 used for the edge detection circuit 11 for the low side.

A signal of the change interval position information P is input to the counter 12. The change interval position information P is, as described above, information identifying a position of the data interval that includes the time Ct1 at which the number of the turned-on transistors (hereinafter referred to as the turned-on transistor count) is changed for the first time (see FIG. 3). In one example, the change interval position information P is a digital value having a plurality of bits (e.g., 4 bits) or an analog voltage value. The turned-on transistors are either the PMOS transistors for the high side or the NMOS transistors for the low side (the same applies hereinafter).

The memory 13 is a desired storage device for storing data or information. In this example, the memory 13 is a shift register. However, the memory 13 may include NAND- or NOR-type flash memory or may be another storage medium such as static random-access memory (SRAM), magnetoresistive random-access memory, or resistive random-access memory.

The memory 13 stores information about a sequence of the numbers of turned-on transistors (turned-on transistor counts) in advance in the form of data or data signals (hereinafter referred to as data for consistency). Specifically, pieces of data containing turned-on transistor counts are stored in an order in which the pieces of the data are applied.

The pieces of the data represent the driving force of the power semiconductor device 10. In one example, the driving force corresponds to the number of the turned-on transistor switches or magnitude of the current flowing into the power semiconductor device 10. A piece of the data representing first driving force of the power semiconductor device 10 corresponds to a first signal, and a piece of the data representing second driving force of the power semiconductor device 10 corresponds to a second signal. The second driving force may be greater than or less than the first driving force. In the present embodiment, the driving force is represented by the turned-on transistor count. However, a way of representing the driving force is not limited to this example. For instance, the transistors may vary in size, and the size of the turned-on transistor may represent the driving force. In this case, output current of the power semiconductor device 10 can be adjusted by switching between the sizes of the turned-on transistors.

The number of bits of one piece of the data is determined depending on a maximum number of the transistors included in either the high-side drive circuit 5A or the low-side drive circuit 5B. In one example, if the number of bits is 3, the number of the turned-on transistors that can be defined is up to 8. In the drawing, the number of bits is denoted as "X" ("X" is an integer greater than or equal to 1). In one example, if 3 bits of the data represents five turned-on transistors, a string of the bits of the data is "101".

One or more data intervals before the data interval (a data interval DSp) that includes the time Ct1 at which the turned-on transistor count is changed for the first time, i.e., one or more data intervals before the data interval identified by the change interval position information P, are each described as an initial data interval DSini. The data interval DSp is a data interval (the third data interval in this example) in which the turned-on transistor count is changed for the first time after the reference time Rt at which the power semiconductor device 10 is turned on.

Figure 5:
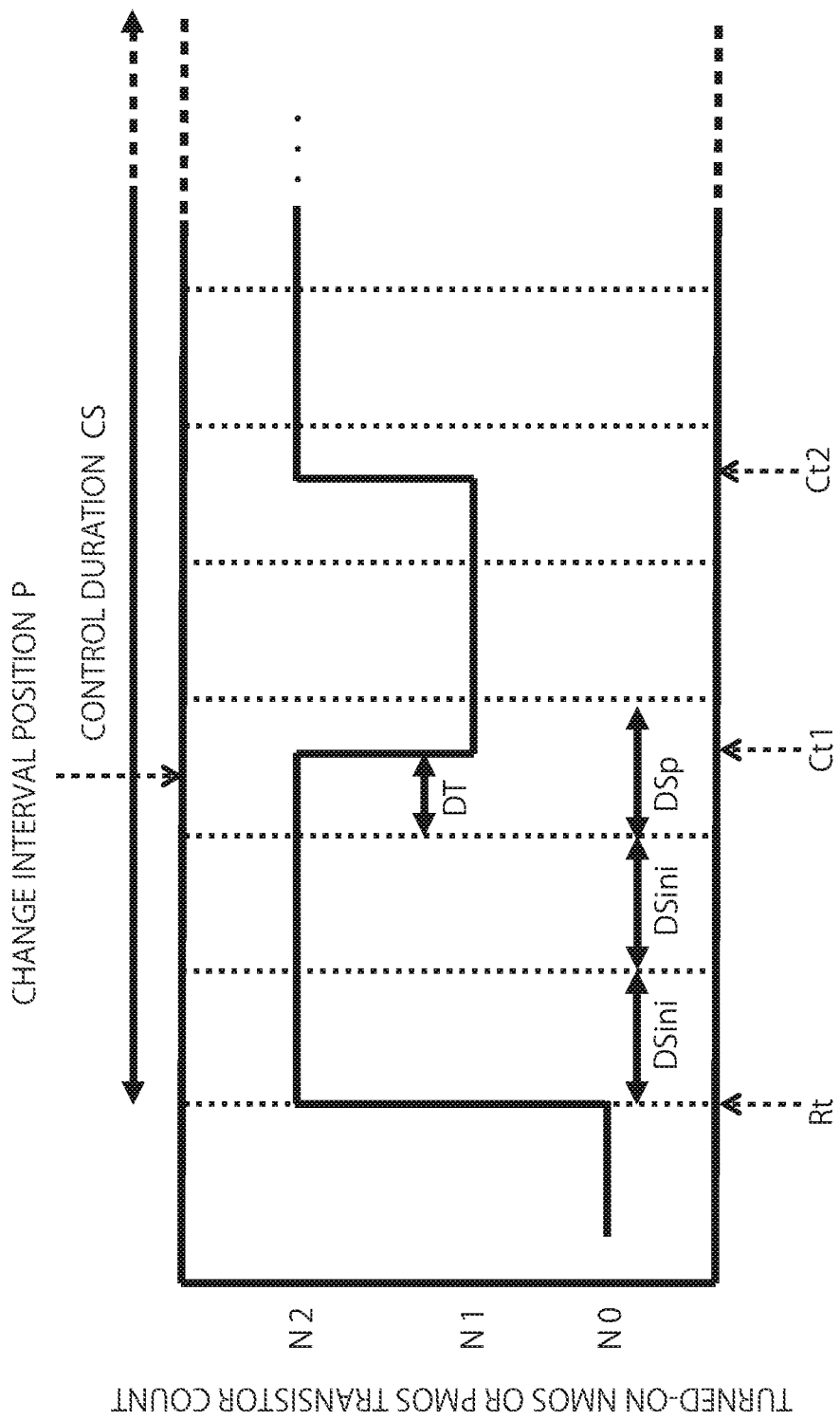
FIG. 5 is a graph showing an initial data interval and a subsequent data interval in the example of FIG. 3.

FIG. 5 shows the initial data interval DSini and the data interval DSp in the example of FIG. 3.

The position of the data interval DSp corresponds to the change interval position P described above. The initial data interval DSini is a data interval before the data interval DSp.

In an example of FIG. 5, the two initial data intervals DSini are present. However, only one piece of the initial data interval DSini may be present. Since the turned-on transistor count is the same (fixed) during these initial data intervals DSini, only one piece of the data common to the initial data intervals DSini is stored in memory 4.

For the data interval DSp and subsequent data intervals, a piece of data containing a turned-on transistor count is stored for every sampling time corresponding to a time length of each data interval.

In this way, only one piece of the data is stored for the initial data intervals DSini. This contributes to a reduction in size of the memory 4. An increase in the number of the initial data intervals DSini enhances an effect of the size reduction. However, a piece of the data may be stored for every one of the initial data intervals DSini.

The counter 12 in FIG. 4 counts the number of pulses from the clock corresponding to the sampling time of each of the initial data intervals DSini starting from the time when the edge detection circuit 11 detects the edge. At the time of the start of counting, i.e., in response to detection of the on/off instruction signal, the process circuit outputs (sends) initial data (fixed data) stored in the memory 13. After that, until the initial data intervals continue, the process circuit repeatedly outputs a piece of the initial data whenever the number of the pulses in the clock cycle corresponding to the initial data interval is counted. After the initial data intervals end, the process circuit outputs pieces of data following the initial data in an order in which the pieces of the data are stored whenever the counter counts the number of the pulses from the clock corresponding to each sampling time. In other words, before the sampling time is counted "N" times ("N" is an integer greater than or equal to 2; in this example, 2), the memory 13 repeatedly outputs a piece of the initial data whenever the sampling time is counted. After the sampling time has been counted "N" times, the memory 13 outputs the pieces of the data following the initial data to a delay circuit 41 at sampling time intervals. Thus, one piece or more of the initial data and the subsequent pieces of the data are output in order at a constant data output rate. In this way, after a lapse of the sampling time or "n" times ("n" is an integer greater than or equal to 2) of the sampling time counted by the counter 12, the memory 13 outputs the pieces of the data following the initial data in order at the sampling time intervals.

In an example of FIG. 4, the two initial data intervals DSini are present, and in the two initial data intervals DSini the memory outputs pieces of the initial data (described as Dini) at intervals of a predetermined number of pulses (e.g., 1 pulse) of the clock. Then, data D1 corresponding to the data interval DSp is output and after that, data D2, data D3 . . . are output whenever predetermined pulses in each clock are counted (at intervals of the sampling time or the first time). In this way, two pieces of the initial data Dini and data D1, data D2, data D3 . . . are output at a constant data output rate. In one example, if a width of the data interval (the sampling time) is, for example, 10 ns, the rate (speed) of data output from the memory 13 is 100 MS/s.

In one configuration example, the memory 13 may have data lines equal in number to the bits of the data on an output side to output the data. In one example, to output 3-bit values in parallel, three signal lines corresponding to 3 bits are connected to the output side of the memory 13, for example.

The level shifter 3 translates data, on/off instruction signals, and clocks sent from the process circuit 2 from one level to another for the high side (voltage increase) and outputs the level-translated data, on/off instruction signals, and clocks to the high-side control circuit 4A. The level shifter 3 may be disposed between the high-side control circuit 4A and the high-side drive circuit 5A rather than between the process circuit 2 and the high-side control circuit 4A.

The buffer 7 corrects voltages of data, on/off instruction signals, and clocks sent from the process circuit 2 (for example, corrects voltage drops caused by wiring resistance) and outputs the corrected data, on/off instruction signals, and clocks to the low-side control circuit 4B.

Figure 6:
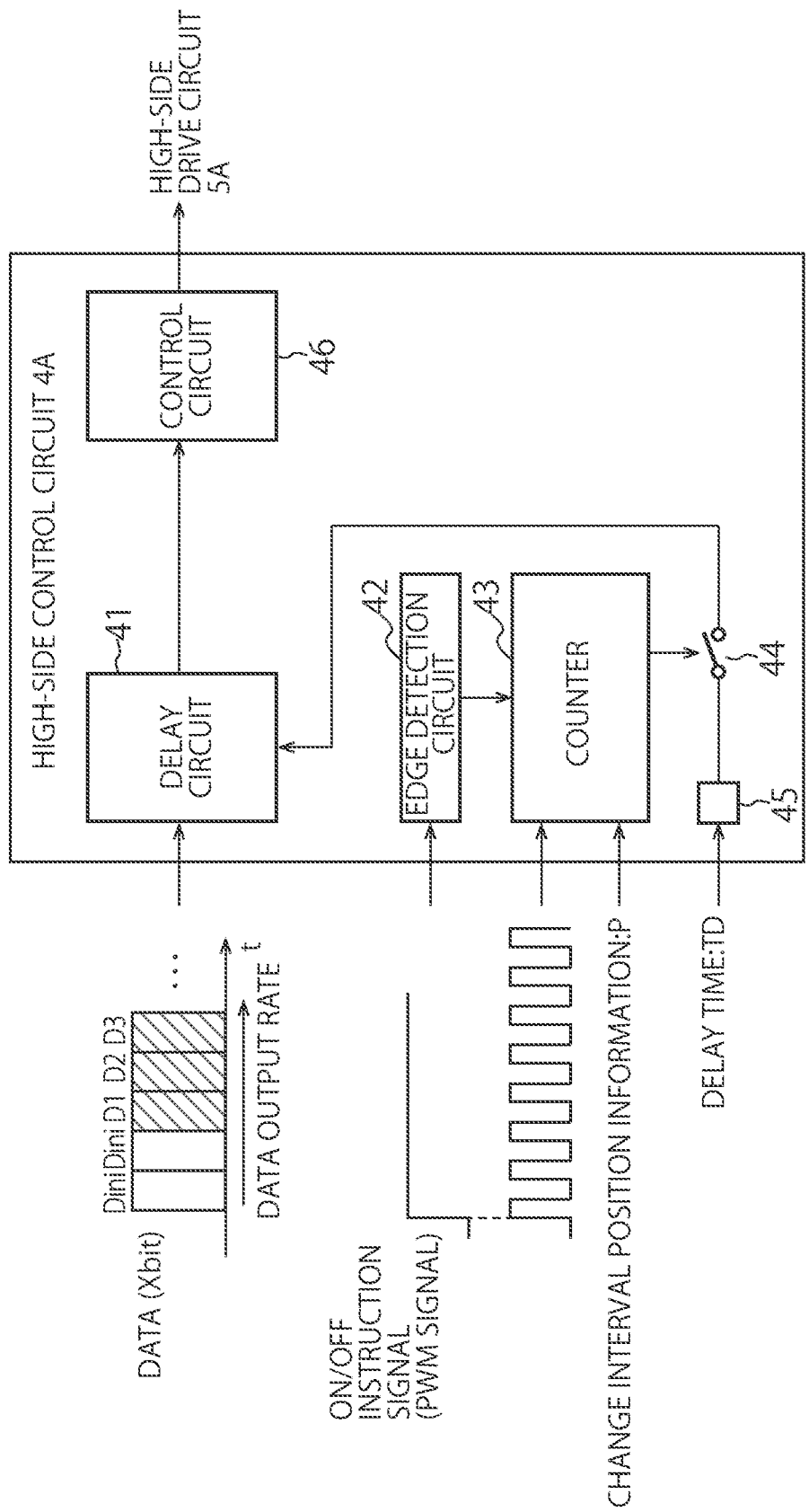
FIG. 6 is a schematic block diagram of a high-side control circuit.

FIG. 6 is a schematic block diagram of the high-side control circuit 4A. A configuration of the low-side control circuit 4B is similar to that in FIG. 6 except that incoming signals are sent from the buffer 7, and thus a description thereof is omitted. The high-side control circuit 4A includes the delay circuit 41, an edge detection circuit 42, a counter 43, a switch circuit 44, a terminal 45 (a receiver circuit), and a control circuit 46.

The edge detection circuit 42 and the edge detection circuit 11 described above are equivalent to an example of a first detection circuit that detects an on/off instruction signal (the third signal) to instruct the drive circuit to cause the power semiconductor device 10 to be turned on (in conduction) or be turned off (non-conduction). Either the counter 43 or the counter 12 described above is equivalent to an example of a first counter according to the present embodiment.

The delay circuit 41 receives pieces of data representing driving force of the power semiconductor device 10 (turned-on transistor counts) from the process circuit 2 through the level shifter 3. In the example of FIG. 5, the delay circuit receives pieces of the data input at intervals of the sampling time (at the constant data output rate) in the order of data Dini, Dini, D1, D2, D3 . . . . In one example, the delay circuit receives 3 bits of the data via three signal lines in parallel concurrently.

The terminal (the receiver) 45 receives a delay instruction signal (a fourth signal) representing the delay time TD shorter than the sampling time with respect to a piece of the data (the data D1, for example, in the drawing) corresponding to the data interval DSp, from the input circuit 9 through a level shifter 6. The level shifter 6 translates delay instruction signals sent from the input circuit 9 from one level to another for the high side (voltage increase) and outputs the level-translated signals to the terminal 45. An inverse of the sampling time is the data output rate.

The terminal 45 is connected to the delay circuit 41 through the switch circuit 44. While the switch circuit 44 is turned off, the delay instruction signal is held in the terminal 45. Hence, the switch circuit 44 has a function of holding the delay instruction signal.

The edge detection circuit 42 receives an on/off instruction signal (a PWM signal) sent from the process circuit 2 through the level shifter 3. The edge detection circuit 42 detects an edge of the on/off instruction signal and outputs an edge detection signal to the counter 43.

The counter 43 receives a clock sent from the process circuit 2 through the level shifter 3. The counter 43 receives a signal carrying the change interval position information P from the input circuit 9. The counter 43 may be configured to receive a signal representing the change interval position information P from the process circuit 2.

The counter 43 starts counting the clock in sync with the edge detection signal (a rising edge in this example). The counter counts pulses from the clock corresponding to a period from the time of input of the edge detection signal (the time of detection of the on/off instruction signal) to an end of all the initial data intervals DSini. In other words, the counter counts a sum of the sampling times corresponding to all the initial data intervals DSini. To put it another way, the counter counts a time up to an end of the data interval just before the data interval DSp identified by the change interval position information P. The change interval position information P (which identifies the third data interval in this example) corresponds to the number of the sampling times (the first times) contained in a period from the time of input of the edge detection signal to a time of the end of the last initial data interval plus 1.

When the sum of the sampling times corresponding to all the initial data intervals DSini is counted, the counter 43 turns on the switch circuit 44. As a result, the delay instruction signal (the fourth signal) held in the terminal 45 is output through the switch circuit 44 and is received by (input into) the delay circuit 41. For instance, if "N" of the initial data intervals DSini are present, the switch circuit 44 outputs the delay instruction signal after the sampling time is counted "N" times. After the sampling time or "n" times of the sampling time is counted, the switch circuit 44 outputs the delay instruction signal.

When the delay instruction signal is received by an enable terminal of the delay circuit 41, a delay process gets enabled. While the delay process is not enabled, the delay circuit 41 outputs (sends) pieces of data (signals representing the driving force of the power semiconductor device 10) input from the process circuit 2 through the level shifter 3 in an order in which the pieces of the data are input at intervals of the sampling time. In other words, the delay circuit outputs the pieces of the data at a constant data output rate. Meanwhile, when the delay instruction signal from the switch circuit 44 is input into the delay circuit, the delay process gets enabled, and the delay circuit 41 delays outputting a piece of the data input at a time in sync with the input of the delay instruction signal for the delay time TD. After a lapse of a sum of the sampling time and the delay time TD, the delay circuit 41 outputs (sends) the delayed piece of the data. Being input at the time in sync with the input of the delay instruction signal means being input, for example, at the time concurrently or within a certain time of error in relation to the input of the delay instruction signal. After the delayed piece of the data is output, the delay process gets disabled, and the delay circuit 41 outputs subsequently input pieces of the data at intervals of the sampling time. The piece of the data input at the time in sync with the input of the delay instruction signal is equivalent to a piece of the data that is input at an interval of the sampling time or "n" times ("n" is an integer greater than or equal to 2) of the sampling time after reception of another piece of the data before the piece of the data. The delay circuit 41 outputs (sends) the delayed piece of the data after a lapse of either the sampling time or "n" times of the sampling time in addition to the delay time TD.

In an example shown in FIG. 6, in sync with the input of the delay instruction signal, the data D1 is input into the delay circuit 41. Thus, the delay circuit 41 delays outputting the data D1 for the delay time TD presented by the delay instruction signal. The delay circuit 41 outputs the data D1 delayed for the delay time TD and after outputting the data D1, outputs data D2, D3 . . . at intervals of the sampling time.

Figure 7:
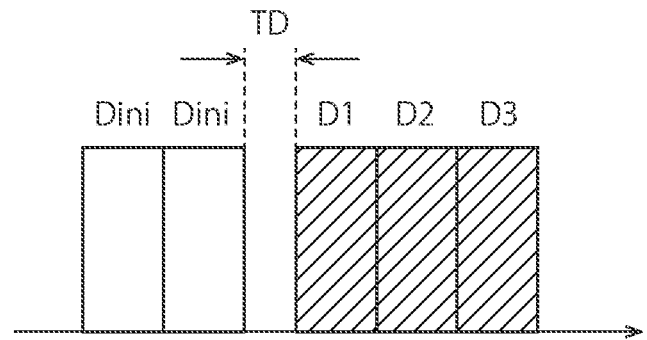
FIG. 7 is a drawing showing an example of a string of data pieces output from a delay circuit.

FIG. 7 shows an example of a string of data pieces output from the delay circuit 41. The first two data Dini are output at intervals of the sampling time. After a lapse of a sum of the sampling time and the delay time TD since outputting of the second data Dini, the data D1 is output. Subsequently to outputting of the data D1, the data D2, D3 . . . are output at intervals of the sampling time.

A resolution of the delay time TD delayed by the delay circuit 41 needs to be higher than a time resolution of the data output rate of the memory 13. In one example, the resolution of the delay time TD is 1 nsec, for example. The delay circuit that provides this delay time may be an analog circuit or a digital circuit having any desired configuration. Examples of the configuration of the delay circuit will be described later.

The data Dini, Dini, D1, D2, D3 . . . output from the delay circuit 41 are input to the control circuit 46.

The control circuit 46 in FIG. 6 controls the high-side drive circuit 5A in response to pieces of the data input in succession from the delay circuit 41. In other words, the control circuit 46 controls turning on and off of the transistors (the PMOS transistors MP0 to MP7) included in the high-side drive circuit 5A. Every time a piece of the data is input from the delay circuit 41, the control circuit 46 selects the transistors in a number represented by the piece of the data and generates control signals to turn on the selected transistors. The control circuit supplies the generated control signals to the gates of the transistors selected to be turned on. Which transistors the control circuit selects is determined in advance based on the numbers of transistors to be turned on. The control circuit 46 may include a logic circuit or a table in terms of configuration.

In one example, when the number of the transistors selected to be turned on is one, the PMOS transistor MP0 is selected, and the PMOS transistors MP0 and MP1 are selected for the two and the PMOS transistors MP0 to MP2 are selected for the three. Similarly, the PMOS transistors MP0 to MP3 are selected for the four, the PMOS transistors MP0 to MP4 are selected for the five, and the PMOS transistors MP0 to MP5 are selected for the six. The PMOS transistors MP0 to MP6 are selected for the seven and the PMOS transistors MP0 to MP7 are selected for the eight. Any method may be used to select the transistors.

Assuming, for example, that the data Dini is "101" (=5), the data D1 is "011" (=3), the data D2 is "011" (=3), and the data D3 is "101" (=5), the five PMOS transistors MP0 to MP4 are turned on first during the sampling time in response to the data Dini input first, and the PMOS transistors MP0 to MP4 are kept turned on during the subsequent sampling time in response to the data Dini input next. Since the input of the data D1 is delayed for the delay time TD, the PMOS transistors MP0 to MP4 continue to be turned on for the delay time TD. After a lapse of the delay time TD, three PMOS transistors MP0 to MP2 are turned on during the sampling time in response to the delayed input data D1. In response to the data D2 input subsequently, the three transistors MP0 to MP2 are turned on during the sampling time and in response to the data D3 input subsequently, the five PMOS transistors MP0 to MP4 are turned on during the sampling time.

In one example, the control signals generated to turn on the PMOS transistors in response to the data Dini input one or more times correspond to a first control signal for driving the power semiconductor device 10 with first driving force. The control signals generated to turn on the PMOS transistors in response to the data D1 input following the data Dini correspond to a second control signal for driving the power semiconductor device 10 with second driving force.

In the present embodiment, the level shifter is disposed between the process circuit 2 and the high-side control circuit 4A. However, rather than disposing the level shifter, the process circuit 2 and the high-side control circuit 4A may be directly connected to each other. Similarly, rather than disposing the level shifter between the input circuit 9 and the high-side control circuit 4A, the input circuit 9 and the high-side control circuit 4A may be directly connected to each other. Similarly, rather than disposing the buffer between the process circuit 2 and the low-side control circuit 4B, the process circuit 2 and the low-side control circuit 4B may be directly connected to each other.

Effects of the present embodiment will now be described. Let us assume that the waveform shown in either FIG. 3 or FIG. 5 is to be generated. A time period (the control duration CS) for which the desired gate waveform is generated is required to be maximum 1 μsec, for example. The number of bits (data size) for defining the number of turned-on transistors is required to be 3 bits, for example. A resolution of 1 nsec, for example, is required to present the delay time DT.

Under the conditions, it is assumed that in a comparative example, a gate waveform similar to that in either FIG. 3 or FIG. 5 is generated by outputting data at a constant rate from a memory to a drive circuit. In this case, a piece of the data for every data interval of 1 nsec is required to be stored in the memory to generate the gate waveform. The data output rate of the memory is required to be 1 GS/s. The number of the data intervals is required to be 1,000. Thus, if the data size is 3 bits, the required memory capacity is 3,000 bits.

In contrast to this, in one example of the present embodiment, a width of the data interval DS is required to have a resolution of 10 nsec, the number of the data intervals (including the initial data intervals) is only 100, and the data output rate of the memory is only 100 MS/s. The data size is 3 bits. Although a delay circuit occupying a small area needs to be added, the required memory capacity is 300 bits.

Even if representing the delay time TD and the change interval position information requires 4 bits each, this does not have a substantial influence. If the number of the initial data intervals is greater than or equal to two, one piece of the data can be shared by the plurality of the initial data intervals. Thus, an increase in the number of the initial data intervals can reduce the required memory capacity. Further, of the control duration CS, for which the gate waveform is controlled, the data intervals in which the number of the turned-on transistors is possibly changed are 10 or less intervals that are successive after the initial data intervals, and the number of the turned-on transistors is constant after the 10 data intervals, for example. In this case, a desired gate waveform is generated (the number of the turned-on transistors is changed) in the 10 data intervals to serve the purpose. As a result, 30 bits for the 10 data intervals and a piece of the data (3 bits) for the initial data intervals are only necessary to serve the purpose. This contributes to a further reduction in memory capacity.

The technique in the present embodiment described above enables electronic circuitry with a small memory capacity and a low data output rate to generate a desired gate voltage waveform.

Modification Example

In the embodiment described above, the delay instruction signal is output from the switch circuit 44 to the delay circuit 41. However, the delay instruction signal may be held in the delay circuit 41 in advance. The delay instruction signal carries information in advance about how much delay time is given to which piece of the data input. When the piece of the data in the number in order is input, the delay circuit 41 delays the piece of the data. The delay circuit 41 may be made up of a digital circuit, an analog circuit, or both these circuits, for example.

Second Embodiment

Figure 8:
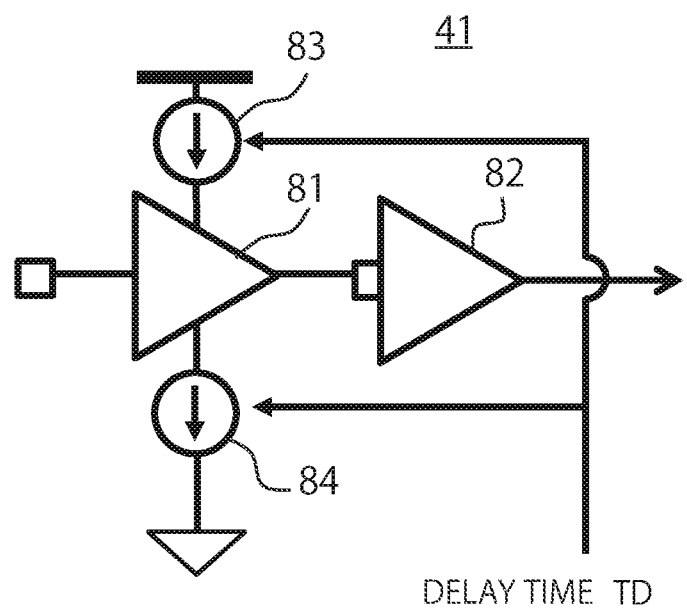
FIG. 8 shows an example of a first configuration of a delay circuit according to a second embodiment of the present invention.

FIG. 8 shows an example of a first configuration of a delay circuit 41 in a gate driver circuit according to a second embodiment of the present invention. The delay circuit 41 includes a first inverter 81 and a second inverter 82 downstream of and connected to the first inverter 81. A current source 83 (a first current source) is connected to a terminal of the first inverter 81 on a source voltage (a first voltage) side, and a current source 84 (a second current source) is connected to a terminal of the first inverter 81 on a reference voltage (a second voltage) side. In one example, the first inverter 81 and the second inverter 82 are each made up of a complementary metal-oxide-semiconductor (CMOS) circuit, and the current sources 83 and 84 are each made up of an n-type or p-type MOS transistor. A configuration of the delay circuit shown in FIG. 8 is disposed for each bit of the data. The shown configuration is provided for a single bit. If the data has 3 bits, three shown configurations are disposed parallel to one another.

Signals matching a corresponding bit of the bits of the data (Dini, Dini, D1, D2, D3 . . . ) from a process circuit 2 are input to an input terminal of the first inverter 81. The first inverter 81 reverses the bit input through the input terminal. The second inverter 82 reverses again the bit reversed by the first inverter 81. An output of the second inverter 82 is connected to a control circuit 46.

The delay circuit 41 is able to control the current sources 83 and 84 to control an output response of the first inverter 81. The delay circuit is thereby able to control a delay time for which the first inverter 81 delays outputting signals. For instance, when the bit "1" is reversed to "0" (e.g., when high-level 10 [V] is switched to low-level 5 [V]), a decrease in current from the current source 84 (throttling back the current source 84) can increase a delay added to the output bit signal. Conversely, when the bit "0" is reversed to "1", a decrease in current from the current source 83 (throttling back the current source 83) can increase a delay added to the output bit signal. In this way, the delay time TD can be controlled by applying voltages associated with an amount of the delay time TD to gates of the current sources 83 and 84 (MOS transistors). The circuit with a relatively small area has such a configuration and hence enables delay.

In an example of FIG. 8, the first inverter 81 is a circuit including one inverter. However, the first inverter 81 may be a circuit including two or more inverters connected in a cascade arrangement. If the number of the inverters connected in the cascade arrangement is an odd number, the inverter circuit reverses the input bit. If the number is an even number, the inverter circuit is a circuit that does not reverse the input bit. The delay circuit 41 controls the first current source connected between the inverter circuit and the first voltage and the second current source connected between the inverter circuit and the second voltage to control the output response of the inverter circuit. The second inverter 82 is a circuit including one inverter. However, the second inverter 82 may be a circuit including two or more inverters connected in a cascade arrangement. If the number of the inverters connected in the cascade arrangement is an odd number, the inverter circuit reverses the input bit. If the number is an even number, the inverter circuit is a circuit that does not reverse the input bit.

In the configuration shown in FIG. 8, the current sources are connected to the first inverter 81. The current sources may be connected to the second inverter 82.

Figure 9:
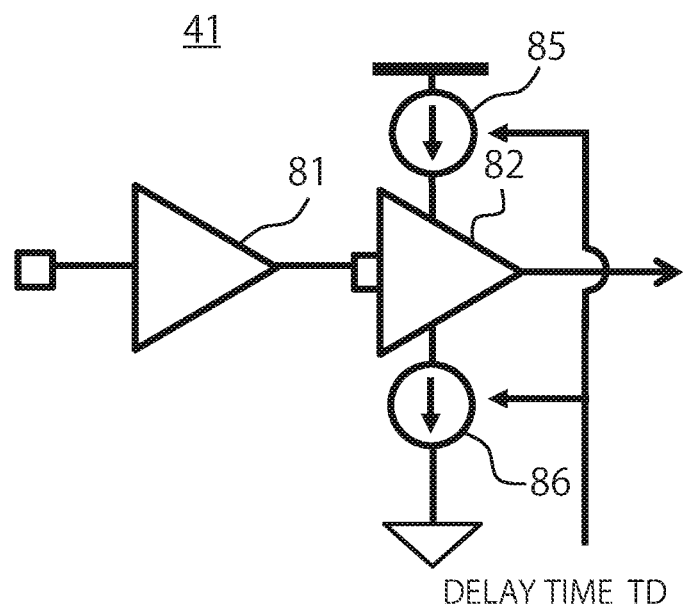
FIG. 9 shows an example of a second configuration of the delay circuit according to the second embodiment.

FIG. 9 shows an example of a second configuration of the delay circuit 41 in the gate driver circuit according to the second embodiment of the present invention. A current source 85 (a third current source) is connected to a terminal of the second inverter 82 on a source voltage (a third voltage) side, and a current source 86 (a fourth current source) is connected to a terminal of the second inverter 82 on a reference voltage (fourth voltage) side. Since the delay circuit in FIG. 9 is similar to that in FIG. 8 except that an inverter whose output response is controlled is the second inverter 82, a description of operation in FIG. 9 is omitted. If the second inverter 82 is a circuit including two or more inverters connected in a cascade arrangement, the delay circuit controls the third current source connected between the inverter circuit and the third voltage and the fourth current source connected between the inverter circuit and the fourth voltage to control the output response of the inverter circuit.

Two current sources may be connected to each of the first inverter 81 and the second inverter 82.

Figure 10:
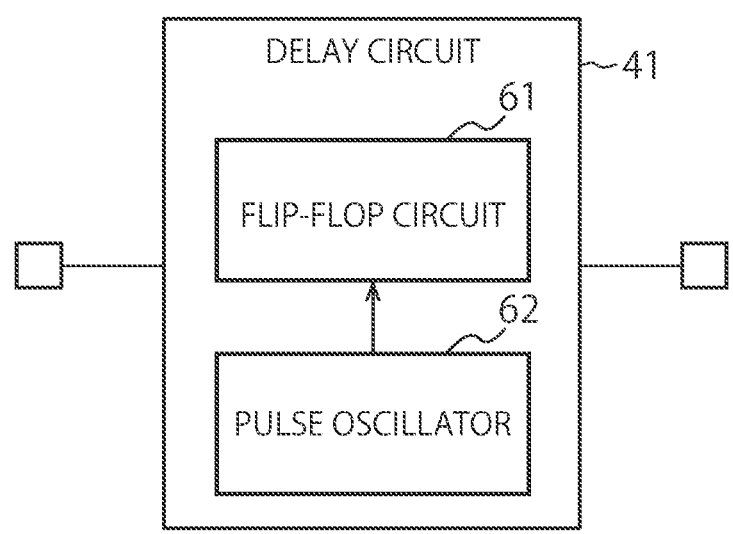
FIG. 10 shows an example of a third configuration of the delay circuit according to the second embodiment.

FIG. 10 shows an example of a third configuration of the delay circuit 41 in the gate driver circuit according to the second embodiment of the present invention. The delay circuit 41 includes a flip-flop circuit 61 and a pulse generation circuit 62. A configuration of the delay circuit shown in FIG. 10 is disposed for each bit of the data. The shown configuration is provided for a single bit. If the data has 3 bits, three shown configurations are disposed parallel to one another. In the configuration shown in FIG. 10, the delay circuit lets the flip-flop circuit 61 operate based on pulses generated by the pulse generation circuit 62. The flip-flop circuit 61 temporarily holds a bit input from the process circuit 2 and operates to output the held bit in accordance with pulses. The delay circuit is able to control the generation of pulses in response to the delay time to delay outputting bit signals. The delay circuit including the flip-flop circuit 61 and the pulse generation circuit 62 can have a reduced area to provide for fine processes.

Third Embodiment

Figure 11:
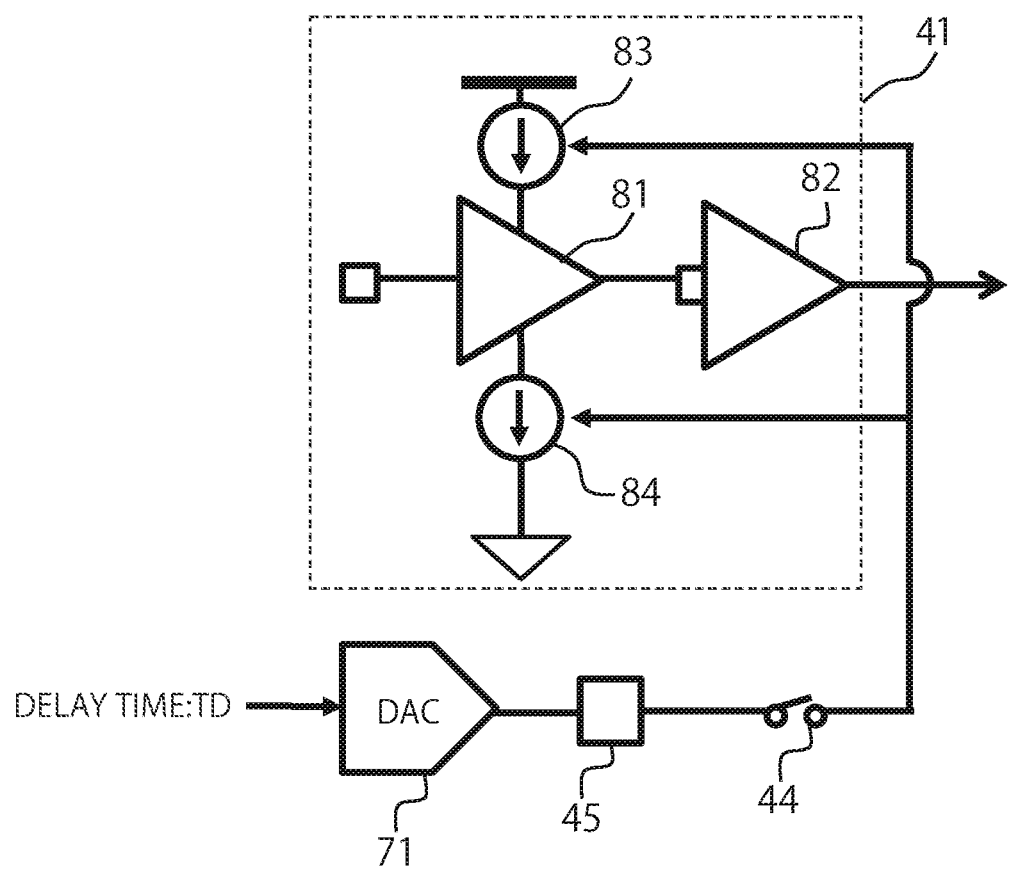
FIG. 11 is a drawing showing an example of a configuration of either a high-side control circuit or a low-side control circuit according to a third embodiment of the present invention.

FIG. 11 shows an example of a configuration of either a high-side control circuit 4A or a low-side control circuit 4B in a gate driver circuit according to a third embodiment of the present invention. The control circuit includes a digital-to-analog converter 71 (a DA converter) to convert digital signals into analog signals when the delay time TD is sent from an input circuit 9 in a form of digital signals. The digital-to-analog converter 71 converts the delay time TD in the form of a digital signal into an analog signal. The delay circuit 41 has the configuration shown in FIG. 8 but may have another configuration. Signals of the delay time sent to the delay circuit 41 may be digital signals because of the configuration shown in FIG. 11. As a result, the signals of the delay time can increase noise resistance.

Figure 12:
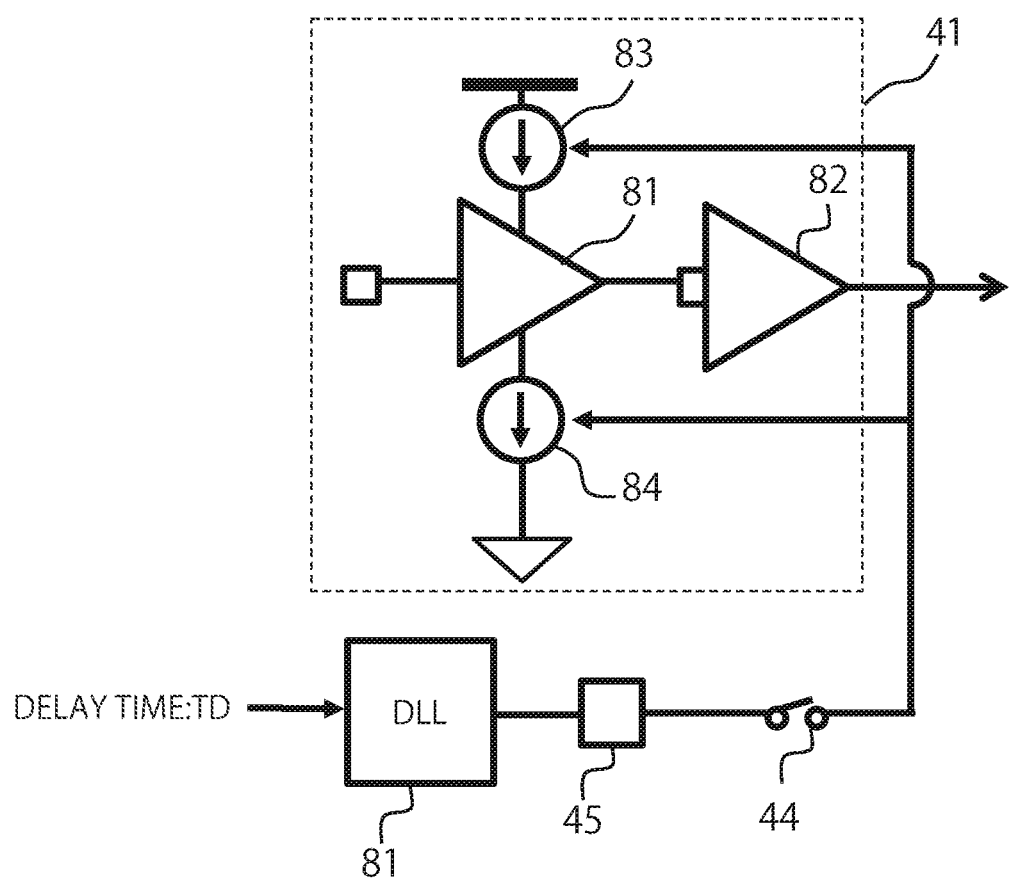
FIG. 12 is a drawing showing an example of another configuration of either the high-side control circuit or the low-side control circuit according to the third embodiment.

FIG. 12 shows an example of another configuration of either the high-side control circuit 4A or the low-side control circuit 4B in the gate driver circuit according to the third embodiment of the present invention. A delay-locked loop circuit (DLL) 81 is disposed upstream of a switch circuit 44. The DLL 81 adjusts phases of incoming signals in accordance with reference signals (internal clock signals). The incoming signals to the DLL 81 may be analog signals or digital signals.

The DLL 81 adjusts the phase of a delay time signal (the fourth signal) that is an incoming signal sent from the input circuit 9 and outputs the phase-adjusted signal to the switch circuit 44. In one example, the DLL keeps the phase difference between the delay time signal and the reference signal (clock signal) constant. The DLL 81 is a circuit that compares the phase of the incoming signal with the phase of the reference signal and controls the gate driver circuit to maintain a fixed relationship between the phase of the incoming signal and the phase of the reference signal. In the gate driver circuit 1 or the semiconductor device 10, owing to factors such as process (P), source voltage (V), and temperature (T), the delay time for the delay circuit can vary. In other words, owing to PVT characteristics such as variations of semiconductor circuit devices (e.g., threshold variations), source voltages, and temperatures, the delay time for the delay circuit can vary. The DLL 81 measures an error in delay time using the reference signal and feeds back an input for correcting the error to enable the gate driver circuit to operate so as to follow the input (compensate for the error). This can prevent variations of the delay of the delay time TD signal from varying irrespective of PVT characteristics. This prevents the delay of the delay instruction signal and allows the delay time to be fed to the delay circuit 41 with high accuracy.

Fourth Embodiment

Figure 13:
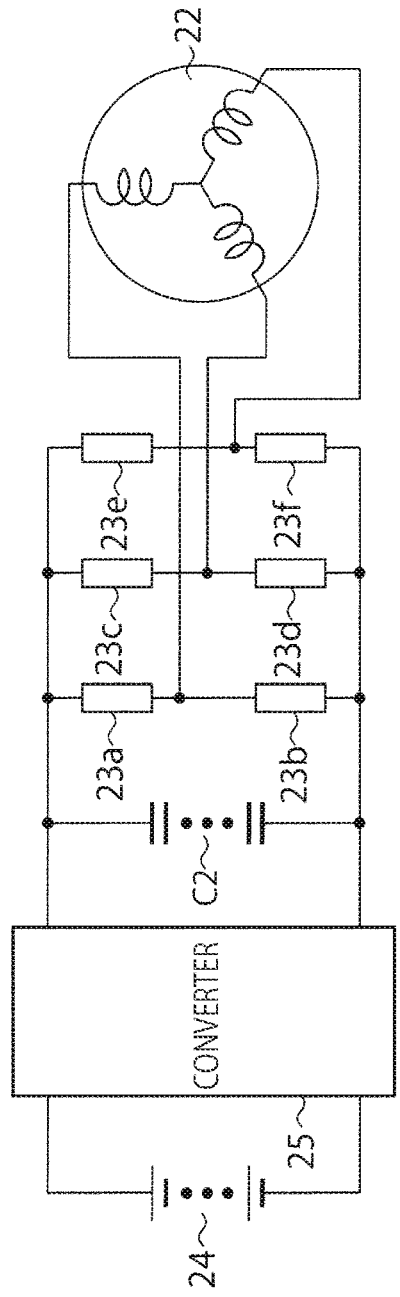
FIG. 13 is a block diagram of a power converter according to a fourth embodiment of the present invention.

FIG. 13 is a block diagram of a power converter according to a fourth embodiment of the present invention. A power converter 21 in FIG. 13 is a three-phase inverter that generates alternating-current (AC) voltages to drive a three-phase motor 22. The power converter 21 includes a plurality of arms 23a to 23f, a direct-current (DC) power source 24, a converter 25, and a smoothing capacitor C2.

The plurality of the arms 23a to 23f each include the gate driver circuit and the power semiconductor device shown in any of the first to third embodiments described above. The arms 23a to 23f operate to be either turned on or off at respective predetermined times.

The converter 25 is a DC-to-DC converter that converts a DC voltage sent from the DC power source 24 from one voltage level to another. The smoothing capacitor C2 smooths the converted DC voltage output from the converter 25.

A pair of two arms of the arms 23a to 23f is simultaneously turned on to let a current flow through a corresponding coil in the three-phase motor 22. The power converter can drive the motor in three phases by switching a pair of two arms that is simultaneously turned on among pairs of arms in turn. In other words, the power converter can switch a pair of switching devices that is simultaneously turned on among pairs in turn to generate three-phase AC from the DC voltage of the DC power source 24. Simultaneously turning on the two arms does not necessarily require points in time at which the two respective arms are turned on to coincide with each other but only requires times during which the two respective arms are turned on to overlap at least partly.

In the embodiments described above, the NMOS transistors may be replaced with PMOS transistors, and the PMOS transistors may be replaced with NMOS transistors. In the embodiments described above, the MOS transistors may be replaced with bipolar transistors, IGBTs, or other power devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. Electronic circuitry comprising:
a control circuit configured to control a drive circuit for a semiconductor device; and
a delay circuit configured to receive a first signal instructing the drive circuit to drive the semiconductor device with first driving force and output the first signal to the control circuit,
wherein the delay circuit is configured to receive a second signal at an interval of a first time or "n" times of the first time after the first signal is received, "n" being an integer greater than or equal to 2, and the second signal instructing the drive circuit to drive the semiconductor device with second driving force, and
the delay circuit is configured to delay outputting of the second signal for a delay time shorter than the first time, and output the second signal to the control circuit after the first signal is outputted and further after the first time or "n" times of the first time and the delay time elapses.

2. The electronic circuitry according to claim 1, further comprising:
a first detection circuit configured to detect a third signal instructing the drive circuit to put the semiconductor device in conduction or non-conduction;
a storage circuit configured to store the first signal and the second signal, the storage circuit being configured to output the first signal to the delay circuit in response to the third signal being detected; and
a first counter configured to count the first time in response to the third signal being detected,
wherein the storage circuit is configured to output the second signal to the delay circuit after the first time or "n" times of the first time is counted by the first counter.

3. The electronic circuitry according to claim 2, further comprising a switch circuit to hold a fourth signal representing the delay time and output the fourth signal to the delay circuit after the first time or "n" times of the first time is counted,
wherein the delay circuit identifies the second signal input in synchronization with an input of the fourth signal as a signal to be delayed.

4. The electronic circuitry according to claim 3, wherein until the first time is counted "N" times, where "N" is an integer greater than or equal to 2, the storage circuit is configured to repeatedly output the first signal each time the first time is counted,
wherein the storage circuit is configured to output the second signal to the delay circuit after the first time is counted the "N" times, and
wherein the switch circuit is configured to output the fourth signal after the first time is counted the "N" times.

5. The electronic circuitry according to claim 3, further comprising a digital-to-analog (DA) conversion circuit to convert the fourth signal that is a digital signal into an analog signal,
wherein the switch circuit is configured to send the fourth signal converted into the analog signal to the delay circuit.

6. The electronic circuitry according to claim 3, further comprising a delay-locked loop circuit to receive the fourth signal, adjust a phase of the fourth signal based on a difference between the phase of the fourth signal and a phase of a reference signal, and supply the phase-adjusted fourth signal to the switch circuit.

7. The electronic circuitry according to claim 3, wherein the delay circuit includes:
a first circuit including one of a first inverter and two or more cascaded first inverters to reverse or not reverse a bit of one of the first signal and the second signal and transmit the bit; and
a second circuit including one of a second inverter and two or more cascaded second inverters to reverse or not reverse the bit reversed by the one or more first inverters and transmit the bit revised by the one or more first inverters,
wherein the delay circuit, in response to the fourth signal, is configured to control an output response of at least one of the first circuit and the second circuit.

8. The electronic circuitry according to claim 7, wherein the delay circuit includes:
a first current source connected between the first circuit and a first voltage; and
a second current source connected between the first circuit and a second voltage,
wherein the delay circuit is configured to control the first current source and the second current source to control the output response of the first circuit.

9. The electronic circuitry according to claim 7, wherein the delay circuit includes:
a third current source connected between the second circuit and a third voltage; and
a fourth current source connected between the second circuit and a fourth voltage,
wherein the delay circuit is configured to control the third current source and the fourth current source to control the output response of the second circuit.

10. The electronic circuitry according to claim 3, wherein the first signal, the second signal, and the fourth signal are digital signals,
wherein the delay circuit includes:
a pulse generator configured to generate a pulse; and
a flip-flop circuit configured to hold one of the first signal and the second signal that is input and configured to output the one of the first signal and the second signal in accordance with the pulse, and
wherein the delay circuit is configured to control the pulse generator in response to the fourth signal to delay outputting of the second signal for the delay time.

11. The electronic circuitry according to claim 1, wherein the delay circuit is configured to receive a fourth signal representing the delay time and to delay outputting of the second signal for the delay time carried in the fourth signal.

12. The electronic circuitry according to claim 1, wherein the control circuit, in response to the first signal sent from the delay circuit, is configured to output a first control signal to the drive circuit to drive the semiconductor device, and in response to the second signal sent from the delay circuit, output a second control signal to the drive circuit to drive the semiconductor device.

13. The electronic circuitry according to claim 1, wherein the drive circuit includes a plurality of switching devices connected parallel to each other,
wherein the first driving force represents a number of switching devices that are turned on or off of the plurality of switching devices,
wherein the second driving force represents a number of switching devices that are turned on or off of the plurality of switching devices, and
wherein the number represented by the first driving force differs from the number represented by the second driving force.

14. The electronic circuitry according to claim 1, further comprising the drive circuit.

* * * * *